Figure 1:
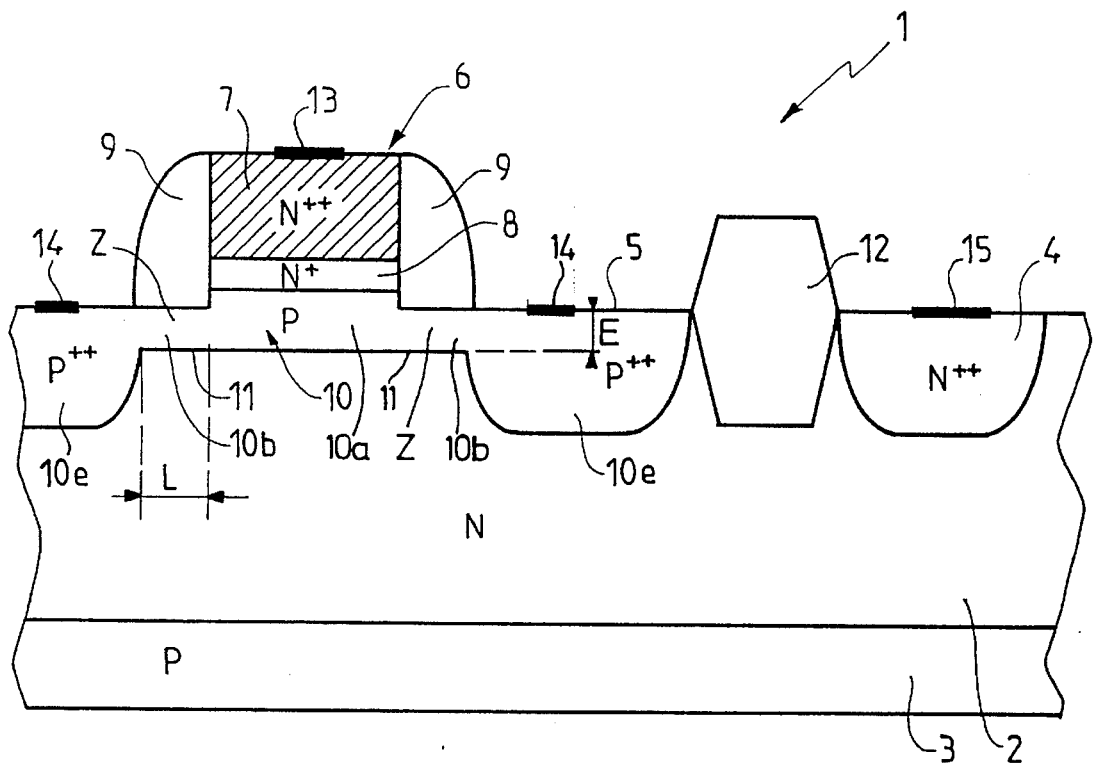

United States Patent [19]
Skotnicki et al.

[11] Patent Number: 5,465,001
[45] Date of Patent: Nov. 7, 1995

[54] ELECTRONIC COMPONENT CAPABLE OF NEGATIVE DYNAMIC RESISTANCE

[75] Inventors: Tomasz Skotnicki, Maylan; Gérard Merckel, Montbonnot, both of France

[73] Assignee: France Telecom, Paris, France

[21] Appl. No.: 178,574

[22] Filed: Jan. 7, 1994

[30] Foreign Application Priority Data

Jan. 12, 1993 [FR] France .................. 93 00197

[51] Int. Cl.⁶ .................. H01L 29/70; H01L 29/73
[52] U.S. Cl. .................. 257/370; 257/592; 257/900
[58] Field of Search .................. 257/592, 591, 257/587, 588, 900, 378, 135, 273, 141, 370

[56] References Cited

U.S. PATENT DOCUMENTS

| | | | |
|---|---|---|---|
| 4,032,961 | 6/1977 | Baliga et al. | 257/592 |
| 4,337,474 | 6/1982 | Yukimoto | 257/592 |
| 5,006,476 | 4/1991 | De Jong et al. | 257/592 |
| 5,109,262 | 4/1992 | Kadota et al. | 257/587 |

FOREIGN PATENT DOCUMENTS

| | | | |
|---|---|---|---|
| 2586862 | 6/1987 | France | H01L 29/78 |
| 57-21502 | 2/1982 | Japan | H01L 29/86 |
| 60-176228(A) | 9/1985 | Japan . | |
| 2044758 | 2/1990 | Japan | H01L 27/06 |
| 1397789 | 6/1975 | United Kingdom | H03H 5/12 |
| 91/07778 | 5/1991 | WIPO . | |
| WO91/07778 | 5/1991 | WIPO | H01L 29/73 |

OTHER PUBLICATIONS

S. M. Sze; "Semiconductor Devices Physics and Technology"; 1985; pp. 111–113.
Jambotkar, C. G., "A Lambda Device", IBM Technical Disclosure Bulletin, 20(8):3123–3124, Jan. 8, 1978.

Primary Examiner—Rolf Hille
Assistant Examiner—Wael M. Fahmy
Attorney, Agent, or Firm—Arnold, White & Durkee

[57] ABSTRACT

The semiconductor electronic component comprises, within a semiconductor substrate (3), a first active region (2,4) having a first type of conductivity (n, $n^{++}$), and a second active region (10), having a second type of conductivity (p, $p^{++}$), opposite that of the first type, located between the first active region (2) and the upper face (5) of the substrate. A projecting region (6), containing a third active region (7, 8) having the first type of conductivity ($n^+$, $n^{++}$) and surmounting a first part (10a) of the second active region, is provided on the upper face of the substrate. Metallizations (13, 14, 15) are respectively located in contact with the three active regions (4, 10e, 7). The second active region includes a depletable semiconductor zone (Z) extending outside the first part (10a) of the second active region, and between the first active region (2) and the upper face (5) of the substrate. Depletion means (11; 213b, 209b, 211), located in the immediate vicinity of this depletable zone (Z) and suitable for depleting the said depletable zone under the action of a selected bias voltage, are also provided.

20 Claims, 7 Drawing Sheets

ELECTRONIC COMPONENT CAPABLE OF NEGATIVE DYNAMIC RESISTANCE

The invention relates to semiconductor components capable of exhibiting a configuration of negative dynamic resistance.

Such components make it possible especially to produce small-sized static-memory points, as well as signal generators or circuits for automatically regulating or stabilizing an operating point. All these functions are used, in particular, in integrated circuits for telecommunication systems.

Electronic components capable of exhibiting a negative dynamic resistance, that is to say a current/voltage configuration in which the current decreases when the voltage increases, are known, especially from British Patent No. 1,397,789. However, such components are produced from discrete elements and consequently do not offer an integrated structure.

U.S. Pat. No. 4,032,961 describes an dynamic resistance. However, in such a structure, the emitter contact is located on the substrate which renders it incompatible with CMOS/BiCMOS fabrication technologies (which combine, onto the same silicon chip, n- and p-channel insulated-gate transistors (CMOS transistors) associated, for example, with a npn bipolar transistor) since the substrate would then serve as common emitter for all the transistors fabricated simultaneously and these would then be no longer insulated from each other. Currently, no integrated structure is known which is capable of exhibiting a negative dynamic resistance, and which is compatible with CMOS/BiCMOS fabrication technology.

The invention aims to overcome this deficiency.

The invention therefore firstly proposes a semiconductor electronic component, capable of exhibiting a configuration of negative dynamic resistance; according to a general characteristic of the invention, this component comprises, within a semiconductor substrate, a first active region having a first type of conductivity, for example the n type, and a second active region, having a second type of conductivity, for example the p type, opposite that of the first type, this second active region being located between the first active region and the upper face of the substrate; moreover, on the upper face of the substrate, a projecting region is provided containing a third active region, having the first type of conductivity, for example the n type, and surmounting a first part of the second active region; metallizations are respectively located in contact with the three active regions; the second active region includes a semiconductor zone capable of being depleted, called "depletable" zone, extending outside the first part of the second active region, and between the first active region and the upper face of the substrate; biasable depletion means are then provided which are located in the immediate vicinity of this depletable zone and are suitable for depleting the said depletable zone under the action of a selected bias voltage.

It should be pointed out here that the invention provides a solution to the problem posed by proposing a semiconductor electronic component, structurally similar for the most part to a vertical bipolar transistor, but not operating as a bipolar transistor under the application of the said bias voltage.

Thus, if, nevertheless, terms usually characterizing the structure of a bipolar transistor are used, the first active region may be called, by analogy, "emitter" or "collector", whereas the second active region may be called "base", and the third active region may be called "collector" or "emitter".

In one embodiment, the depletable zone is formed by a second part of the second active region possessing a dopant concentration substantially identical to that of the first part of the second active region (this first part being that located beneath the third active region located in the projecting part), as well as a thickness lying between a lower thickness limit and an upper thickness limit, both these thickness limits being related to the value of the dopant concentration.

Thus, if a dopant concentration of $10^{17}$ cm$^{-3}$ is selected, it will be possible to adjust the thickness of the depletable zone to a value of the order of 0.15 µm.

Moreover, it is particularly advantageous for the length of the second part of the second active region, forming the depletable zone, to be at least equal to a length limit which may be at least of the order of 0.3 µm, and preferably at least equal to 0.5 µm.

Moreover, in order especially to limit current leakage, it is preferable that the projecting region of the semiconductor component includes insulating lateral regions located on its lateral edges and partially or totally surmounting the depletable zone.

According to one embodiment of the invention, the component may include a metallic zone surmounting an insulating layer located on the upper face of the substrate above the depletable zone, the metallic zone/insulating layer/depletable zone/first active region stack then forming an insulated-gate field-effect transistor, the metallic zone of which forms the gate and the depletable zone of which forms the channel region.

The depletion means may include the junction between the first active region ("collector") and the second part forming the depletable zone ("intrinsic base"). They may also include the gate of the insulated-gate field-effect transistor.

In the embodiment of the component, exhibiting as depletion means an insulated-gate field-effect transistor, each insulating lateral region advantageously includes a portion located on the lateral edge of the third active region, prolonged substantially at right angles by a portion forming the said insulating layer of the insulated-gate field-effect transistor; the metallization located in contact with the third active region then incorporates the metallic zone forming the gate of the transistor.

During the use of the component according to the invention, the negative dynamic resistance is obtained from the current/voltage relationship taken at the active region which would be considered as the collector of a bipolar transistor. In order to do this, fixed selected voltages are applied to the "base" and "emitter" regions in order to forward bias the "emitter/base" junction, whereas a suitable bias voltage is applied as "collector" voltage either to reverse bias the "collector/base" junction in order to deplete the depletable zone or to deplete the channel of the insulated-gate field-effect transistor.

The subject of the invention is also a method of fabricating a semiconductor electronic component capable of exhibiting a configuration of negative dynamic resistance, according to a general characteristic of the invention, this method comprises the following steps:

a) beneath the upper face of a first semiconductor zone having a first type of conductivity (for example the n type) is implanted, incorporated within a semiconductor substrate, a first semiconductor layer having a second type of conductivity (for example the p type) opposite that of the first, b) a second layer of a semiconductor material is deposited onto the upper face of the substrate (or of the first semiconductor layer) and a selected implantation of dopants is carried out within this second layer in order to confer on it the first type of conductivity (for example the n type), c) an etching of this second doped layer is carried out in order to form a semiconductor zone projecting above the substrate, as well as an overetching of the first layer in order to form within this first layer, on each side of the projecting part of the semiconductor block thus formed, a thinned zone having the same dopant concentration as that part of the first layer located beneath the projecting semiconductor zone, and a thickness lying between a lower thickness limit and an upper thickness limit, these two thickness limits being related to the said dopant concentration, d) contact locations are defined on the first semiconductor zone, the first conducting layer and on the semiconductor projecting zone, and e) metallizations are produced on the said contact locations.

According to one way of implementing the method, in step d), a first insulating layer is deposited onto the substrate and the projecting part, and an etching of this first insulating layer is carried out in order to form on each side of the projecting part insulating lateral regions surmounting, at least partially, the thinned zone of the first semiconductor layer; an overdoping of the first layer is carried out on each side of the insulating lateral regions and outside the thinned zone in order to form an overdoped zone on which the corresponding contact location will be defined, the distance separating this overdoped zone from that part of the first semiconductor layer, located beneath the semiconductor projecting zone, defining the length of the thinned zone.

It is possible to define this length of the thinned zone by etching the insulating lateral regions in order to confer on them, at their base resting on the substrate, a thickness substantially equal to the said length; in this case, the overdoping of the first semiconductor layer is carried out on the semiconductor block thus formed, the insulating lateral regions serving as masks. In order to perform the etching of such insulating lateral regions, the said first insulating layer may advantageously be etched in order to form first insulating lateral regions partially surmounting the said thinned zone, these first lateral regions being, for example, composed of silicon dioxide; next, a thin insulating layer, for example also of silicon dioxide, is deposited onto the upper surface of the semiconductor block thus formed and then an additional insulating layer made of an insulating material, for example silicon nitride, different from that forming the thin insulating layer and the first insulating lateral regions, is deposited; next, there follows an etching of this additional insulating layer in order to form second insulating lateral regions covering the first; the first and second insulating lateral regions, as well as the thin insulating layer located between them, then form the said insulating lateral regions having a thickness substantially equal to the length of the thinned zone; next, that part of the insulating thin layer located outside the insulating lateral regions is removed.

As a variant, the insulating lateral regions may also be etched in order to confer on them a thickness, at their base, less than the desired length of the thinned zone; a mask, extending beyond, on each side, beyond the insulating lateral regions by a distance equal to the difference between the length desired for the thinned zone and the thickness of these insulating lateral regions, is then deposited onto the semiconductor block thus formed and the overdoping of the first semiconductor layer is carried out on the semiconductor block furnished with this mask which extends beyond the said regions.

In order to obtain an electronic component furnished with an insulated-gate field-effect transistor capable of depleting its channel, after having formed the insulating lateral regions and locally overdoped the first semiconductor layer, the insulating lateral regions are removed and another insulating layer, including a part located on the lateral edges of the projecting part of the block and a part prolonging this lateral part substantially at right angles, is deposited and, in step e), a metallization is carried out in contact with the projecting semiconductor zone, being prolonged into a metallic zone extending over the right-angled terminal part of the insulating layer.

In the case where the substrate incorporates, alongside the first semiconductor zone, another semiconductor zone within which an insulated-gate field-effect transistor is simultaneously produced, the active drain and source regions of which exhibit the second type of conductivity (for example the p type) and are implanted according to two successive implantations of selected dopants (LDD implantation), the upper face of the first semiconductor layer is advantageously masked, in step c), before carrying out the first implantation of the drain and source zones of the insulated-gate field-effect transistor.

Figure 2:
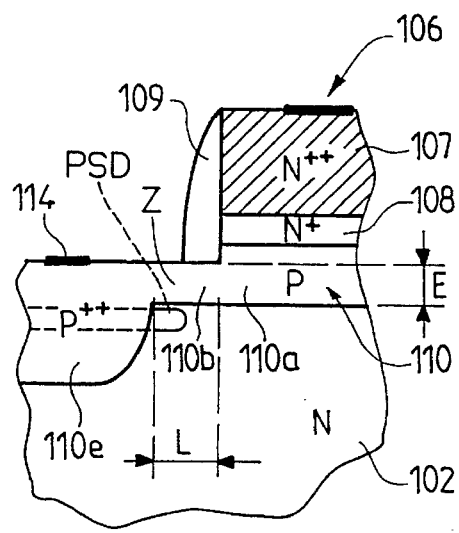
Figure 3A:
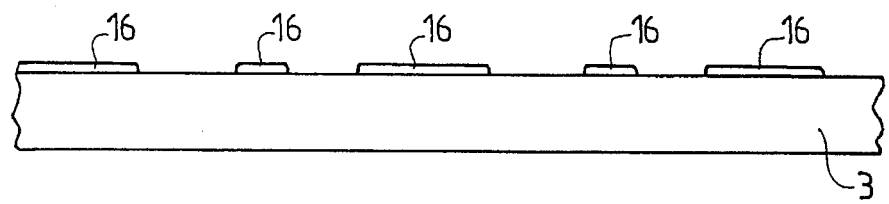
Figure 3B:
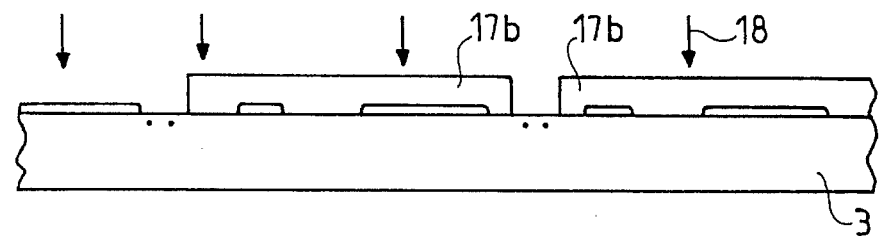
Figure 3C:
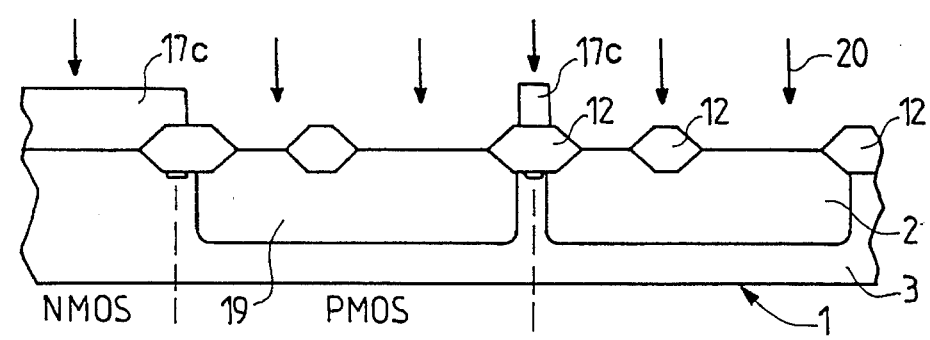
Figure 3D:
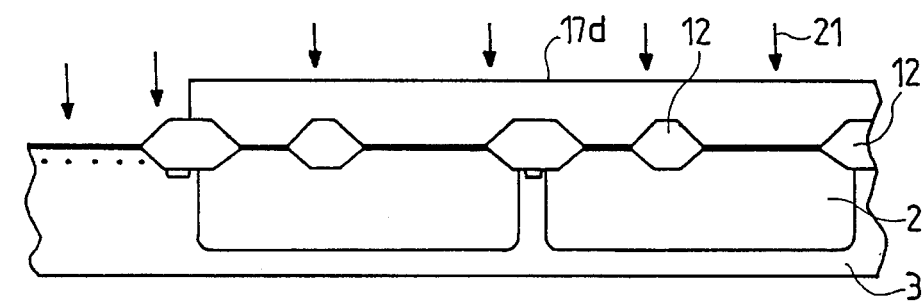
Figure 3E:
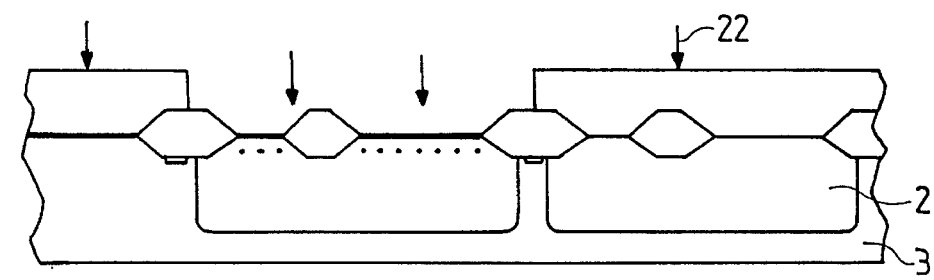
Figure 3F:
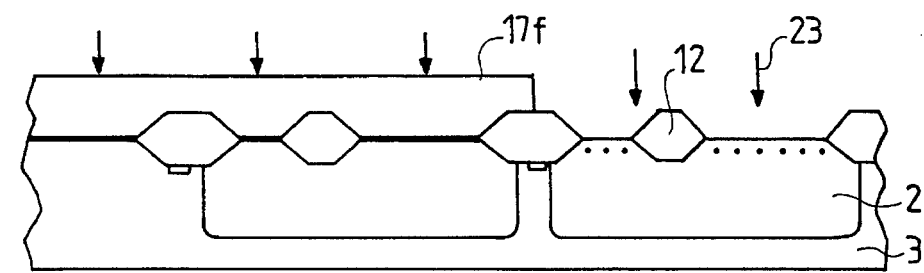
Figure 3G:
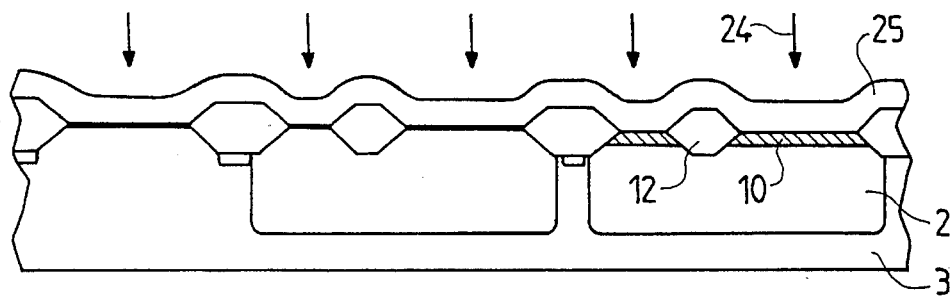
Figure 3H:
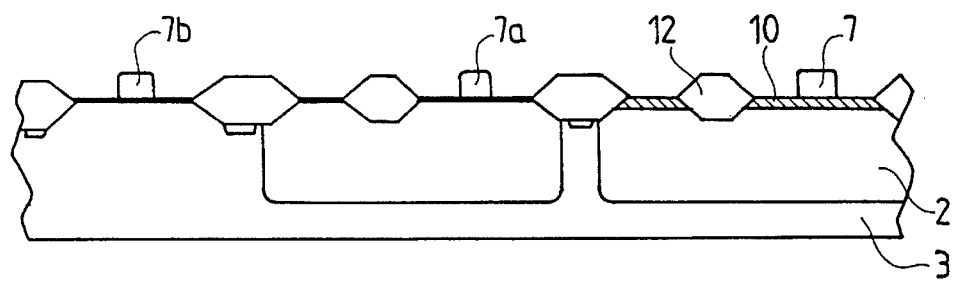
Figure 3I:
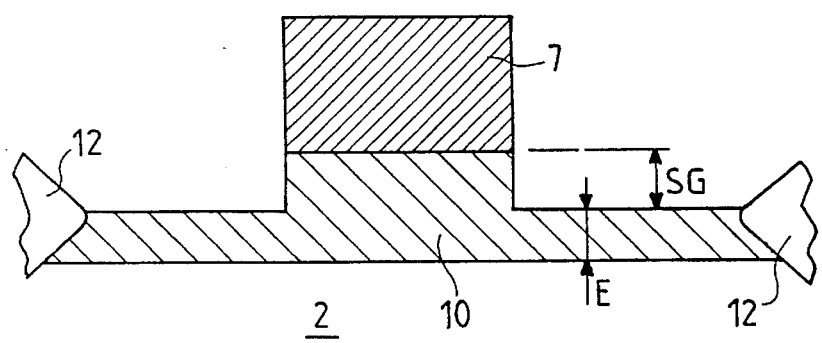
Figure 3J:
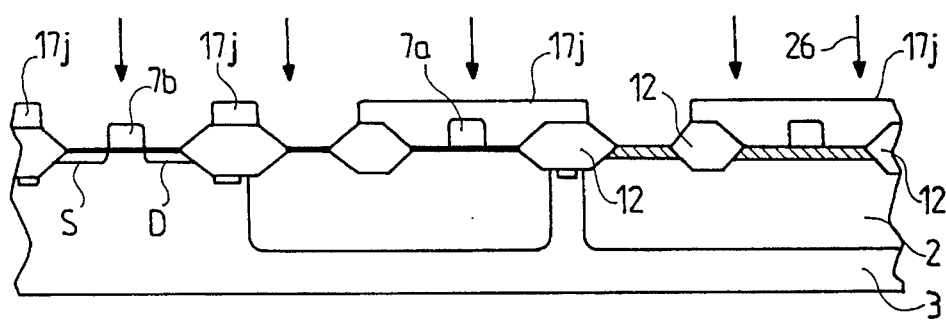
Figure 3K:
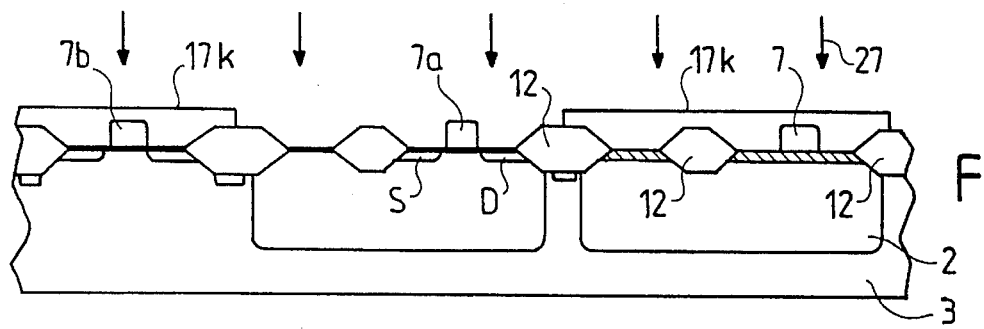
Figure 3L:
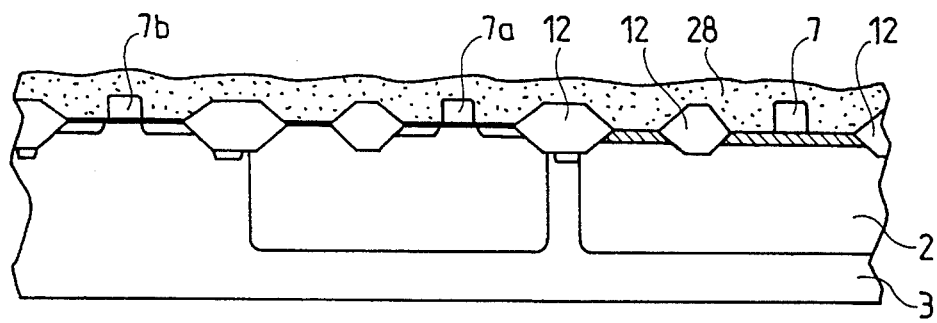
Figure 3M:
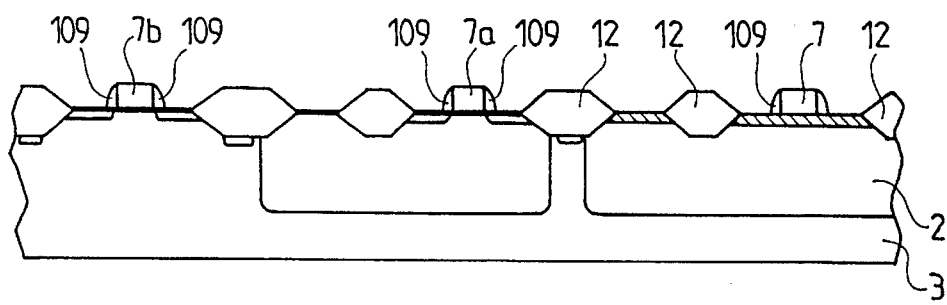
Figure 3N:
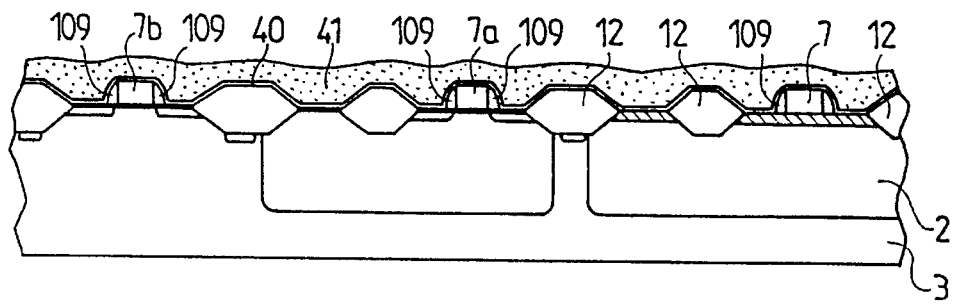
Figure 3O:
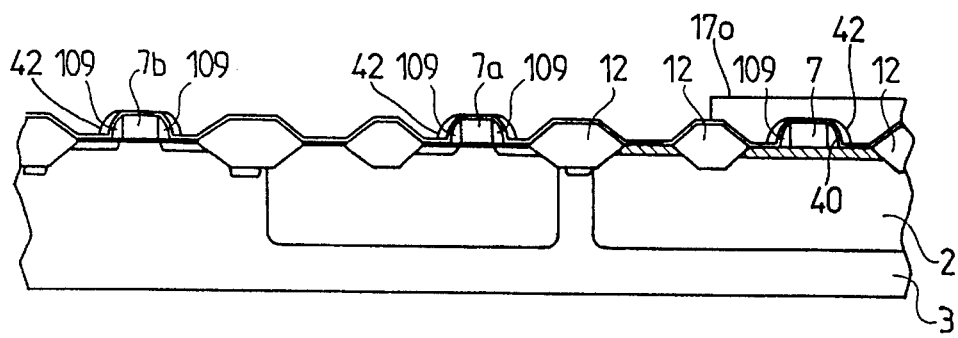
Figure 3P:
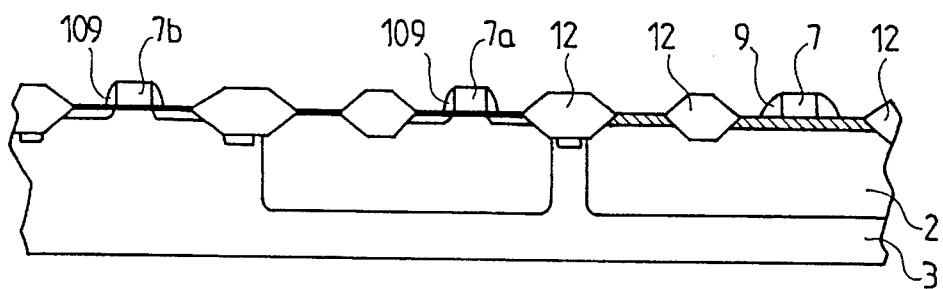
Figure 3Q:
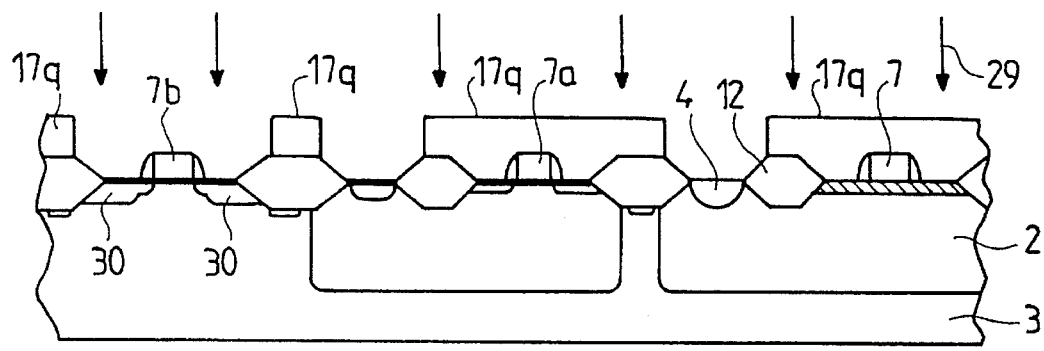
Figure 3R:
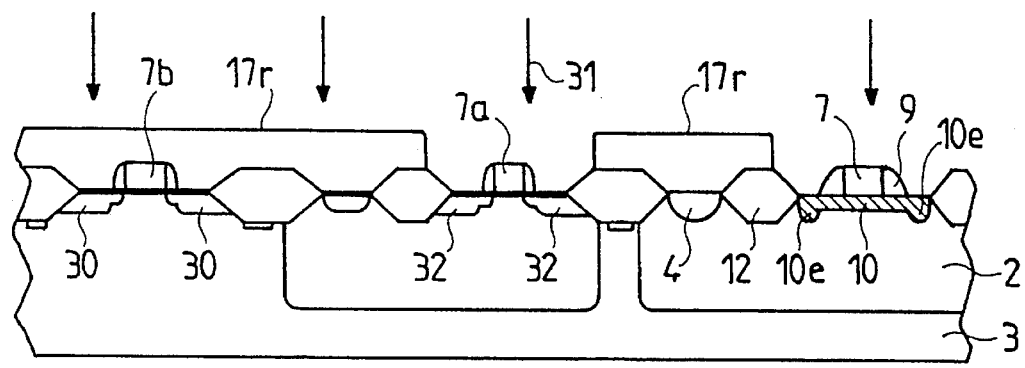
Figure 3S:
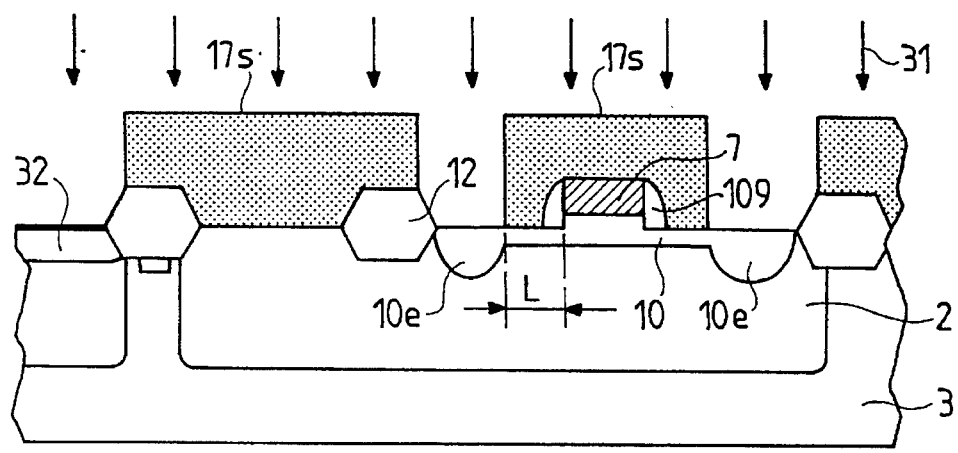
Figure 4:
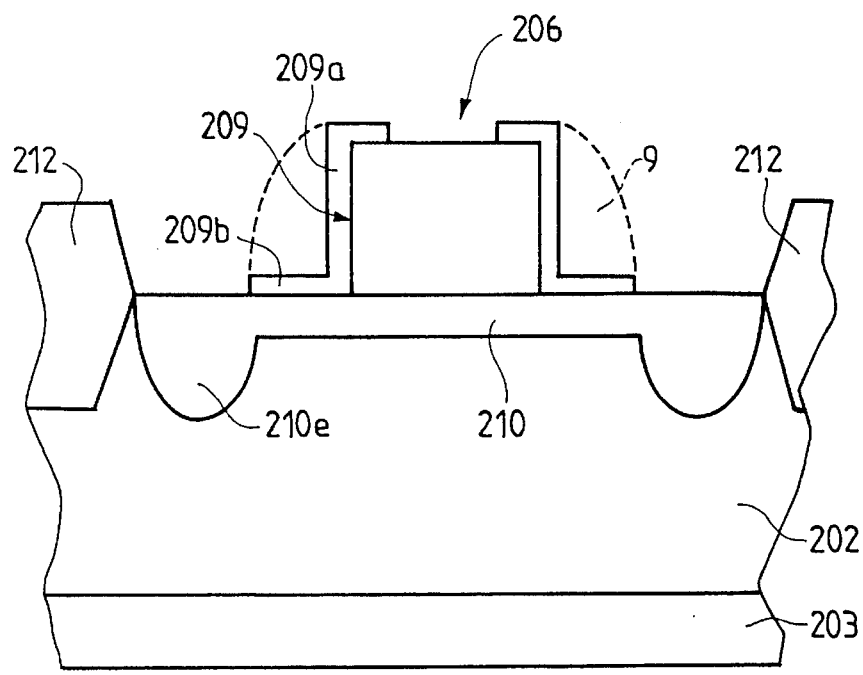
Figure 5:
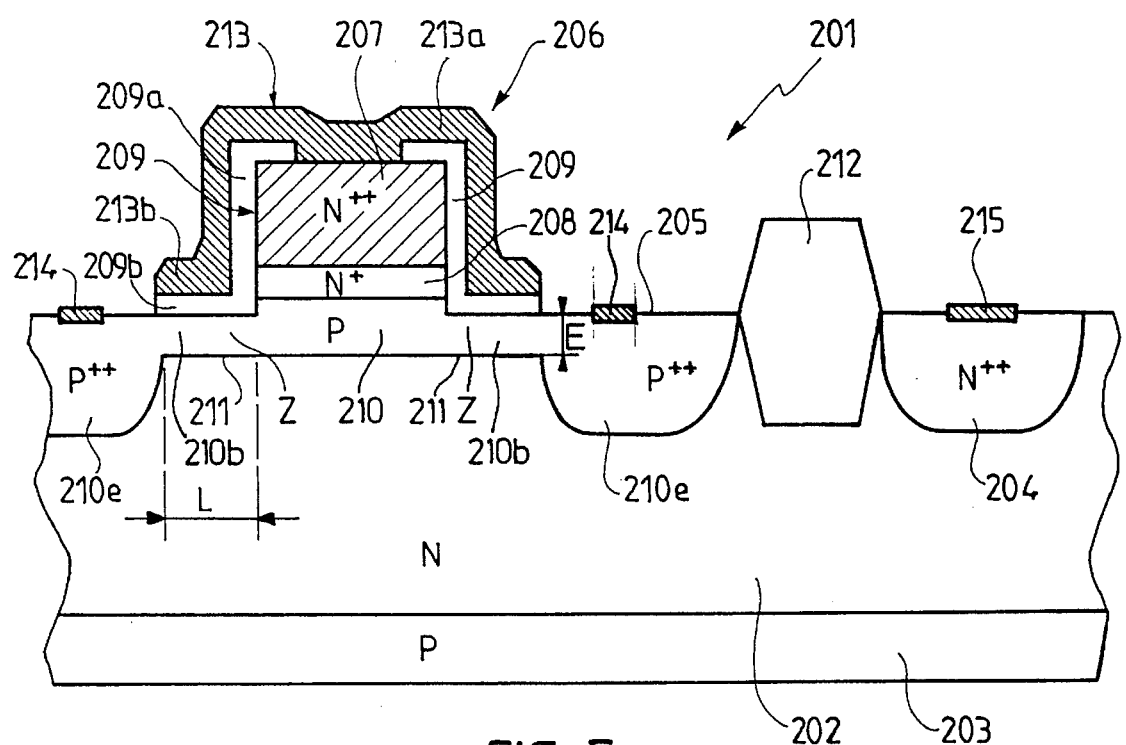

Other advantages and characteristics of the invention will appear on examining the description, detailed hereinbelow, of an embodiment of and a way for implementing the invention, these both being non-limiting and illustrated in the appended drawings in which:

FIG. 1 illustrates diagrammatically a first embodiment of an electronic component according to the invention, FIG. 2 illustrates partially a second embodiment of a component according to the invention, FIGS. 3a to 3s illustrate steps of a method of fabrication according to the invention, FIG. 4 illustrates a variant of such a method of fabrication, and FIG. 5 illustrates another embodiment of an electronic component according to the invention.

As illustrated in FIG. 1, the component 1 is produced within a semiconductor zone or well 2, having a first type of conductivity, here the n type (conduction by electrons), incorporated within a semiconductor substrate 3 having a second type of conductivity, opposite that of the first, here the p type (conduction by holes). To the right (regarding FIG. 1) of an insulating region 12, known by the person skilled in the art in the semiconductor field by the name LOCOS, the well 2 incorporates an $n^{++}$-overdoped zone 4 on which a metallization 15 is located. By way of indication, an overdoping of the $n^{++}$ (or $p^{++}$) type is equivalent to an electron (or hole) concentration approximately equal to $10^{20}$ $cm^{-3}$ whereas, in an n-(or p-)doped region, the electron (or hole) concentration is of the order of $10^{17}$ $cm^{-3}$ or less.

To the left of the insulating region 12, the component 1 includes a second region 10 having the second type of conductivity, here the p type, extending within the n well from the upper face 5 of the substrate. This second region 10 possesses a central part 10a having a p-doping concentration, flanked by a $p^{++}$-overdoped zone 10e on which a contact metallization 14 is provided.

A projecting region 6 surmounts the upper face 5 of the substrate (or of the second region 10) above the p-doped central part of the second region. This projecting region 6 includes, in its central part, a region 7, composed for example of polysilicon, having the first type of conductivity and $n^{++}$-overdoped. Beneath this region 7 of overdoped polysilicon is located a layer 8 of $n^+$-doped silicon surmounting the central part 10a of the p-doped region 10. The projecting region 6 also includes, on each side of the regions 7 and 8, insulating lateral regions 9, or spacers, composed for example of silicon dioxide $SiO_2$. A contact metallization 13 is provided at the top of this projecting region 6, in contact with the $n^{++}$-overdoped silicon.

Beneath the spacers 9, the second region 10 exhibits a zone thinned in relation to the central part 10a located beneath the layer 8 of $n^+$ silicon. This thinned zone 10b has a length L and a thickness E. It also has, naturally, the same dopant concentration as the central part 10a. It will be seen hereinbelow that this thinned part or zone 10b forms a depletable zone Z capable of being depleted by biasable depletion means under the action of a selected bias voltage. These depletion means are formed here by the junction 11 between the n well and the second region 10.

It may be seen in FIG. 1 that the structure of the electronic component according to the invention is for the most part similar to a conventional structure of a vertical bipolar transistor, such as that produced according to the BiCMOS fabrication technology. The structural difference from a vertical bipolar transistor resides here in the presence of a depletable zone having a doping and dimensions which are selected, in place of, for example, a $p^+$-doped implanted zone, defining a non-uniform doping of the extrinsic base, known by the person skilled in the art by the vocable LDEB (Lightly Doped Extrinsic Base). Thus, in the electronic component according to the invention illustrated in FIG. 1, the first active region, defined here by the well 2 and the contact location 4, may be designated, by analogy, by the vocable collector (the actual n well defining the intrinsic collector whereas the overdoped region 4 defines the extrinsic collector). Likewise, the second region 10 may be considered as a second active "base" region in which the overdoped regions 10e define the extrinsic base. Finally, the third active region, formed by the regions 7 and 8, may be likened to an "emitter" region in which the $n^{++}$-overdoped region defines the extrinsic emitter, whereas the $n^+$-doped region defines the intrinsic emitter.

In the remainder of the text, for the purposes of simplification, the terms emitter, base and collector will be used although, as explained hereinabove, these are not actually appropriate for the component according to the invention, the operation of which, as will be seen in more detail hereinbelow, is not related to that of a bipolar transistor.

FIG. 2 illustrates partially another embodiment of a component according to the invention. In this figure, the elements similar or having similar functions to those represented in FIG. 1 are assigned references increased by 100 in relation to those which they had in FIG. 1. Only the differences between these two figures will be described now.

In this embodiment of FIG. 2, the thickness of the spacers 109, that is to say their dimension taken at their base resting on the upper face of the substrate counted parallel to the length L of the depletable zone Z, is this time less than the length L of this depletable zone, whereas, in FIG. 1, this thickness was substantially equal to the length L. In other words, while in FIG. 1 the spacers totally surmounted the thinned part 10b forming the depletable zone of the component, the spacers 109, in FIG. 2, surmount the depletable zone Z only partially.

During the use of the component according to the invention, selected fixed voltages are applied, in a general manner, to the metallizations of the extrinsic-base and emitter regions in order to forward bias the emitter/base junction, whereas a variable bias voltage, which will reverse bias the collector/base junction, is applied to the metallization of the extrinsic collector in order to deplete the depletable zone. The negative dynamic resistance will then be obtained from the collector current/voltage relationship.

More specifically, in the example described, where the thickness E of the thinned zone 10b is of the order of 0.15 μm, with a dopant concentration of the order of $10^{17}$ cm$^{-3}$ and a length L of the order of 0.5 μm, it was found to be possible to deplete the region Z with a positive collector bias of the order of a few volts by connecting the emitter to earth and by applying a fixed voltage of the order of 0.5 volts to the base. When the collector voltage is zero, the collector current is negative. At the beginning of the increase in the collector voltage, the collector current decreases in absolute value until reaching the zero value and then increases in absolute value, since the collector/base junction is decreasingly forward biased. As the collector voltage increases, the collector/base potential difference becomes positive, which reverse biases the collector/base junction. This results in an increase in the collector current which, however, does not become stabilized as a function of the collector voltage, as would occur in a bipolar transistor, since the increase in the collector voltage simultaneously brings about an expulsion, out of the zone Z, of the majority carriers (the holes, here) and therefore a progressive depletion of the zone Z by the field effect of the junction 11 and therefore a modulation of the access resistance of the base, and, consequently, a gradual cut-off of the passage of the current into the base. The collector current then decreases despite the increase in the collector bias voltage, which therefore creates the characteristic of negative dynamic resistance. The collector current will begin to increase again from a higher or lower collector voltage threshold, which is due either to a breakdown in the base or an avalanche phenomenon in the collector/base junction.

Such an operation has been illustrated for a component structure which could be structurally likened to an npn vertical bipolar transistor. Of course, given a reversal of all the dopant types, which would result in a component structure according to the invention which can be likened to a pnp transistor, the emitter/base junction would be forward biased and the collector/base junction would be reverse biased by reversing all the signs of the voltages applied to the metallizations.

In the embodiments of FIGS. 1 and 2, both the thickness E and the dopant concentration play an essential role in the depletable character of the zone Z. Indeed, it is advisable for this thickness E to be greater than or equal to a lower thickness limit, the value of which is related to the dopant concentration in the depletable zone. Indeed, if this thickness E is less than the lower thickness limit, the zone Z will not be depletable but, on the contrary, will be depleted naturally by itself in the absence of application of any bias voltage on the extrinsic collector. Of course, in this case the component according to the invention will not be able to operate and exhibit a configuration of negative dynamic resistance.

Likewise, the thickness E of this depletable zone must remain less than or equal to the upper thickness limit, likewise related to the dopant concentration, but also to the value of the bias voltage which it is desired to apply in order to deplete the zone. Indeed, if this thickness E is greater than this upper thickness limit, it will be difficult, indeed impossible, to deplete the zone Z, with the application of reasonable bias voltages, indeed even with the application of high bias voltages.

Specifically, in the case of a dopant concentration of the order of $10^{17}$ cm$^{-3}$ and with the purposes of using low bias voltages, for example less than 5 volts, the lower thickness limit may be taken to be of the order of 0.1 μm, whereas the upper thickness limit may advantageously be adjusted to be of the order of 0.2 μm. Nevertheless, the person skilled in the art will understand that these numerical values are to be taken by way of indication and may be adjusted more precisely for each fabricated complex as a function especially of its fabrication batch, on the basis of tests and/or of simulation.

Moreover, although the length L of the depletable zone does not influence the depletable character of this zone, it exerts an influence on the drop in the collector current. Indeed, if the length L of this zone is insufficient, significant base-current leakage may appear, despite complete depletion of the zone Z. It is therefore particularly advantageous to adjust the length L of this zone so that it is at least equal to a lower length limit which has been taken in this case to be of the order of 0.3 μm.

One way of implementing a method of fabrication, enabling especially the embodiments illustrated in FIGS. 1 and 2 to be obtained, will now be described with reference to FIGS. 3a to 3s.

In a general manner, the method of fabrication according to the invention comprises the steps of:

implantation, beneath the upper face of a first semiconductor zone having a first type of conductivity (n type for example), incorporated within a semiconductor substrate, of a first semiconductor layer having a second type of conductivity (p type, for example) opposite that of the first, deposition, on the upper face of the substrate (or of the first semiconductor layer), of a second layer of a semiconductor material, followed by a selected implantation of dopants in order to confer on this second layer the first type of conductivity, etching of this second doped layer in order to form a semiconductor zone projecting above the substrate, and overetching of the first layer in order to form, within this first layer, on each side of the projecting part thus formed on the semiconductor block, a thinned zone having the same dopant concentration as that part of the first layer located beneath the projecting semiconductor zone, and a thickness lying between a lower thickness limit and an upper thickness limit, both these being related to the said dopant concentration, definition of contact location on the first semiconductor zone, the first semiconductor layer and the semiconductor projecting zone, and production of metallizations on the contact locations.

Such a method of fabrication is perfectly compatible with a fabrication technology of the BiCMOS type, as will now be seen.

In FIG. 3a, the reference 3 designates a semiconductor substrate of p-doped silicon, for example, within which an n-channel insulated-gate field-effect transistor (NMOS transistor) and a p-channel insulated-gate field-effect transistor (PMOS transistor) will be produced simultaneously, these two transistors forming a CMOS complex, as well as the electronic component according to the invention.

The first step thus consists in defining the location of the active zones of the various components, depositing nitride layers 16 onto the upper face of the substrate 3.

In the next step (FIG. 3b), an iso-boron implantation 18 is carried out after having arranged masks 17b over the zones in which the PMOS transistor and the component having negative dynamic resistance will be produced. This iso-boron implantation makes it possible especially to prevent the inversion phenomenon beneath the insulating (LOCOS) regions which will be produced within the p-substrate in the next step.

In the step of FIG. 3c, there follows, in a known manner, a localized oxidation of silicon dioxide so as to form the insulating (LOCOS) regions 12 and then the nitride layers are removed and there follows, after having placed a mask 17c over the left-hand part of the substrate (with regard to the figure), an implantation 20, of phosphorus or arsenic for example, so as to form the retrograde wells 2 and 19 within which the component i according to the invention and the PMOS transistor will be respectively produced. As regards the NMOS transistor, this will be produced in the left-hand part of the substrate. Finally, after implantation, an annealing operation is performed.

In the step of FIG. 3d, there follows, after having arranged a mask 17d above the wells 2 and 19, two boron implantations 21 so as especially to adjust the threshold of the NMOS transistor and to protect it from the phenomenon known as "breakdown". In step 3e, by analogy, the threshold of the PMOS transistor is adjusted by carrying out a boron implantation 22 after having arranged masks above the well 2 and the zone of the NMOS transistor.

During these steps, a thin layer of oxide has been deposited onto the upper face of the substrate, including in the region of the component having negative resistance, and which will especially constitute the gate oxides of the field-effect transistors.

Next, there follows a removal of this insulating thin layer above the well 2 and an implantation 23, of boron for example, is carried out on the semiconductor block furnished with a mask 17f covering the zones of the field-effect transistors. The base region 10 of the component having negative dynamic resistance is thus formed.

A layer 25 of polysilicon is next deposited (FIG. 3g) onto the upper face of the substrate before undergoing an implantation 24, of arsenic for example, in order to confer $n^{++}$-type doping on it. After having carried out a rapid annealing operation, there follows (FIG. 3h) an etching of this layer of doped polysilicon so as to define, respectively, the gate regions 7a and 7b of the PMOS and NMOS transistors and the "emitter" region 7 of the component having negative dynamic resistance. As regards the NMOS and PMOS transistors, the production of the gate regions only includes an etching of the layer of doped polysilicon since the substrate remains insulated by a thin layer of oxide. On the other hand, as regards the component having negative dynamic resistance, the etching is prolonged by a slight overetching OE of the substrate, as illustrated in FIG. 3i, so as to produce, on each side of the projecting (emitter) region thus formed on the semiconductor block, a thinned zone of thickness E, one part of which will form the depletable zone Z of the component having negative dynamic resistance.

The step illustrated in FIG. 3j consists in producing the lightly doped drain (LDD) and lightly doped source zones of the NMOS transistor by carrying out an implantation 26, of arsenic for example, after having covered the semiconductor block with masks 17j placed at selected positions. Such an implantation also has the effect of making contact with the well 19 of the PMOS transistor and with contact of the well 2 of the component having negative dynamic resistance.

There follows (FIG. 3k) the production of the lightly doped drain (LDD) and lightly doped source regions of the PMOS transistor using an implantation, of boron for example. This implantation requires covering the zone of the NMOS transistor and also the zone of the component having negative resistance beforehand with a mask 17k so as to maintain a uniform dopant concentration in the base region (semiconductor layer 10) located beneath the surface of the well 2.

Next, a layer 28, of silicon oxide for example, undoped, is deposited onto the semiconductor block thus formed (FIG. 3l) and there follows, in the next step illustrated in FIG. 3m, the etching of the spacers associated with each of the projecting regions 7, 7a and 7b. In this variant, all the spacers 109 have the same thickness, while, in the variant illustrated in FIG. 3p, the spacers 9 associated with the component having negative dynamic resistance are wider at their base than the spacers 109 associated with the NMOS and PMOS field-effect transistors.

The production of the widened spacers 9 is illustrated in FIGS. 3n and 3o. Firstly, a thin layer 40 of silicon dioxide is deposited onto the upper surface of the semiconductor block obtained in the stage illustrated in FIG. 3m. Next, a thick layer 41 of silicon nitride $Si_3N_4$ is deposited onto this thin layer 40. Next, there follows a partial etching of the layer 41 in order to produce spacers 42 of $Si_3N_4$ resting on the thin layer 40 around the spacers 109 of $SiO_2$. A mask 17o is then deposited onto that part of the semiconductor block intended to form the component having negative dynamic resistance and there follows a chemical etching of the spacers 42 of the NMOS and PMOS transistors. Next, the mask 17o is withdrawn and the thin layer 40 is removed. The configuration illustrated in FIG. 3p, in which the "spacer 109 of $SiO_2$/thin layer 40 of $SiO_2$/spacer 42 of $Si_3N_4$" assembly forms the widened spacers 9 is thus obtained.

It should be noticed that the use of two different insulations (silicon dioxide and silicon nitride) in order to produce the widened spacers enables selective chemical etching to be carried out. Moreover, the prior deposition of the thin layer 40 of silicon dioxide further enables the chemical etching to be stopped level with this thin layer so as not to etch away the upper face of the (bare Si) substrate as well as the spacers 109 made of silicon dioxide.

Such a method therefore enables spacers of different thicknesses to be obtained in a simple and effective manner on the same silicon chip.

Next (FIG. 3q), a mask 17q is especially arranged above the projecting regions of the component having negative resistance and of the PMOS transistor and there follows an implantation 29 of arsenic so as to produce the highly doped source and drain regions 30 of the NMOS transistor. It will be recalled here that the source and drain zones thus possess $n^+$ doping beneath the spacers and $n^{++}$ doping between the $n^+$ region and the insulating (LOCOS) partitions. The $n^{++}$-overdoped contact location 4 of the component having negative dynamic resistance, and the contact location with the well of the PMOS transistor are also produced by this implantation 29.

FIG. 3r especially illustrates the production of highly-doped (PMOS) drain and source zones 32 obtained by an implantation 31 of boron after a mask 17r has been placed above the zone of the NMOS transistor, the contact location of the well of the PMOS transistor and the contact location 4 of the component having negative dynamic resistance. Since the spacers 9 of the negative dynamic resistance component form a mask, this implantation 31 also has the effect of producing the $p^{++}$-overdoped "extrinsic base" regions 10e of the component having negative dynamic resistance. In other words, in this implementation variant, it is the thickness at the base of the spacers which determines the length L of the depletable zone of the component having negative dynamic resistance.

In the case where the component having negative dynamic resistance possesses spacers 109 having a thickness at their base smaller than the length L desired for the depletable zone, it is then necessary, as illustrated in FIG. 3s, to arrange, above the projecting region of the component having negative dynamic resistance, a mask 17s extending, on each side, beyond the spacers 109 by a predetermined distance equal to the difference between the length L desired for the depletable zone and the thickness of the spacers counted from their base.

The final steps of the method of fabrication especially consist in etching the contact holes, then in carrying out a final rapid annealing operation before being followed by the deposition of a layer of metal silicide or of metal and then by etching and annealing the interconnections thus formed.

It should be noted that the $n^+$-doped region 8 in the projecting "emitter" region of the component according to the invention (FIG. 1) is obtained by diffusion of the dopants from the $n^{++}$-overdoped zone during the annealing operations.

The electronic component having negative dynamic resistance according to the invention is thus obtained on the same silicon chip in a variant similar to that illustrated in FIG. 1 (at the position close to the overdoped zone 4 and to the LOCOS 12 which results from the particular choice illustrated in FIGS. 3a to 3s) or in a variant similar (to within the same difference) to that illustrated in FIG. 2 according to the size of the spacers adopted, as well as of the PMOS and NMOS field-effect transistors. Such a component having negative dynamic resistance is consequently compatible with a BiCMOS fabrication technology, the substrate not acting as a common emitter. Moreover, the person skilled in the art will have noticed that given the absence of overetching OE in the step illustrated in FIG. 3i and given the replacement of the mask 17k in the step illustrated in FIG. 3k by a mask covering just the zone of the NMOS transistor, as well as the production of non-widened spacers 109, a vertical bipolar transistor having a non-uniformly doped extrinsic base (LDEB) would be obtained in the place of the component having negative dynamic resistance.

In the method of manufacturing the component having negative dynamic resistance, it is possible, after the step for producing the spacers 9 or 109 and for performing the implantation of the overdoped regions 10e, to remove these spacers in order to deposit a thin insulating layer 209 (FIG. 4) of a thickness of 150 Å which includes a vertical lateral part 209a located on the lateral edges of the projecting region 206, this part 209a being prolonged substantially at right angles by a horizontal part 209b extending over the upper face of the substrate above the thinned part which will form the depletable zone Z of the component having negative dynamic resistance. During the final step of formation of the metallizations, the metallization arranged in contact with the active semiconductor region located in the projecting region 206 will incorporate a metallic zone arranged above the part 209b of the insulating layer.

The embodiment of the component having negative dynamic resistance illustrated in FIG. 5 will thus be obtained at the end of fabrication.

In this figure, elements similar, or having similar functions, to those shown in FIG. 1 have references increased by 200 in relation to those which they had in FIG. 1. Only the differences between these two figures will now be described.

The metallic zone 213b/insulating layer 209b/semiconductor zone 210b/well 202 stack forms an insulated-gate field-effect transistor, the thinned semiconductor part 210b of which forms the channel region. In this embodiment variant, the regions 207 and 208 form this time a "collector" region, whereas the regions 204 and 202 form, respectively, the "extrinsic emitter" and "intrinsic emitter" regions and the region 210 still forms a "base" region.

During the use of this component, fixed selected voltages are applied to the metallizations 215 and 214 (the metallization 215 is, for example, connected to earth, whereas the metallization 214 is connected, in the present case, to a positive voltage of 0.5 volts) in order to forward bias the first active region/second active region (emitter/base) junction, whereas a bias voltage (increasing, in the present case, from the value 0 volt to the value of a few volts) suitable for depleting the channel of the field-effect transistor formed is applied to the metallization of the third active region (collector), the configuration of negative dynamic resistance being always taken from the collector current/voltage pair.

The embodiments which have been described (FIGS. 1 and 2, FIG. 5) use separate depletion means (field effect of a junction, field effect of an insulated-gate field-effect transistor). However, it would be conceivable to use depletion means using the field effect of a junction and the field effect of an insulated gate at the same time. For this purpose, provision could be made for the metallic zone located on the insulating layer 209b to be independent of the metallization 213 of the third active region. In this case, this third active region would form an "emitter" region, whereas the second active region would still form the "base" region and the first active region would form the "collector" region. The metallic zone forming the gate of the field-effect transistor, the channel of which forms the depletable zone, could then be biased in an appropriate manner. Moreover, also by applying a selected and increasing bias voltage to the collector region, the two field effects caused, on the one hand, by the field-effect transistor and, on the other hand, by the collector/base junction could together contribute to depleting the depletable zone. It would thus be possible to obtain a depletion of the more rapid zone with the same collector voltage of a few volts or alternatively even to obtain such a depletion while being less demanding on the dimensional requirements (thickness and length) of the depletable zone and/or on the dopant concentration.

Although described based on silicon, the component according to the invention could be based on another semiconductor material. Moreover, the metallizations have been produced, in all the embodiments described, on $n^{++}$- or $p^{++}$-overdoped regions. The person skilled in the art knows that this is preferable in the case where the semiconductor material used is silicon. Nevertheless, it is possible to be unconstrained by such overdoping of these regions if a semiconductor material is used which enables a satisfactory contact with the metallizations to be obtained directly. Such materials exist among the III–V materials, that is to say materials including, in equal parts, an element of the third column and an element of the fifth column of the Periodic Table of Elements.

Although all the advantages of the invention may be found in the embodiments described hereinabove, it turned out to be advantageous, in some applications, to produce, within the first active region of the substrate, an overdoped zone located beneath the depletable zone. Although this embodiment variant is compatible with all the embodiments described hereinabove, the overdoped zone has been represented only in FIG. 2 and referenced as PSD.

The presence of such an overdoped zone beneath the depletable zone makes it possible, while reducing the depth of the overetching OE, or indeed possibly to eliminate this overetching in some cases, to lead to a thinned depletable zone by an effect of reduction in the depth of the junction and to increase the concentration in the substrate part of the junction and thus to facilitate the depleting of the depletable zone.

Moreover, the reduction in the overetching, that is to say the increase in the thickness E of the depletable zone Z, makes it possible to limit the current leakage in the region of the angle formed at the boundary between the depletable zone Z and the first part 110a of the second active region 110.

In a general manner, the production of this overdoped substrate zone, PSD, located beneath the thinned zone Z is obtained by a deep implantation of dopant having the same type of conductivity as the substrate, in a part of the substrate located beneath the thinned zone. In the case where the substrate is of n type, a deep implantation of arsenic with a dose and an energy selected so as to reach the substrate through the second p-type active region 110 will therefore be performed without, however, altering the type of conductivity of this zone. For example an implantation of arsenic may be selected having a dose of $2\times10^{12}$ per $cm^2$ of surface implanted, with a peak of $10^{17}$ $cm^3$, using an energy of 500 keV.

It is thus possible to reduce the overetching OE by approximately 20% compared to an embodiment variant not providing for this deep implantation of dopant.

This deep implantation of dopant is perfectly integrated into the production method which has been described hereinabove.

Thus, in the case where widened spacers are provided, the implantation of arsenic will be carried out after forming the first insulating lateral regions 109 (FIG. 3m) and before forming the widened insulating lateral regions 9 (FIGS. 3n to 3p).

In the case where spacers 109 are provided which have a width less than the width L of the depletable zone, the implantation of arsenic will advantageously be carried out before installing the mask 17s illustrated in FIG. 3s.

By these two ways of implementing the deep implantation of arsenic, the person skilled in the art will notice that that overdoped zone of the substrate located beneath the depletable zone then extends some distance from the boundary between the depletable zone and the first part 110a of the second active region 110, which has the effect of concentrating the depletion of the depletable zone some distance from the corner of the spacer so as to further limit potential leakage.

Of course, in the case where the substrate would be of p type, it would be necessary to replace the deep implantation of arsenic by a deep implantation of, for example, boron.

We claim:

1. An electronic semiconductor component comprising:

a semiconductor substrate;

a first active region in the substrate having a first conductivity;

a projecting region on an upper face of the substrate, the projecting region comprising a third active region having the first conductivity;

a second active region having a second conductivity opposite the first conductivity, the second active region located between the first active region and the upper face of the substrate and comprising:
a first part located under the third active region and a depletable zone extending from the first part of the second active region between the first active region and the upper face of the substrate;

a depleter for depleting the depletable zone under the action of a selected bias voltage;

first, second and third metallizations respectively in contact with the first active region, the second active region, and a third active region; and wherein the component is adapted to have a negative dynamic resistance.

2. The component of claim 1, wherein the depletable zone is formed by a second part of the second active region.

3. The component of claim 2, wherein the second part of the second active region is thinner than the first part of the second active region.

4. The component of claim 2, wherein:

the first part and second part of the second active region have substantially equal dopant concentrations; and the second part of the second active region has a thickness lying between a lower thickness limit and an upper thickness limit, both said thickness limits being related to the value of the dopant concentration.

5. The component of claim 4, wherein:

the dopant concentration is approximately $10^{17}$ cm$^{-3}$; and the thickness of the depletable zone is approximately 0.15 µm.

6. The component of claim 1, wherein the first active region comprises an overdoped substrate zone beneath the depletable zone.

7. The component of claim 6, wherein the overdoped substrate zone extends from between the depletable zone and the first part of the second active region.

8. The component of claim 2, wherein the second part of the second active region is at least equal in length to a predetermined lower length limit.

9. The component of claim 8, wherein the lower length limit is 0.3 µm.

10. The component of claim 8, wherein the lower length limit is 0.5 µm.

11. The component of claim 1, wherein the projecting region comprises insulating regions on each side of the third active region which surmount a part of the depletable zone.

12. The component of claim 11, wherein the insulating regions include different insulating materials.

13. The component of claim 1, wherein the depleter comprises a junction between the first active region and the second part forming the depletable zone.

14. The component of claim 1, further comprising a metallic zone surmounting an insulating layer located on the upper face of the substrate above the depletable zone, resulting in a metallic zone/insulating layer/depletable zone/first active region stack forming an insulated-gate field-effect transistor wherein the metallic zone of which forms the gate and a channel region forms the depletable zone.

15. The component of claim 14, wherein the depleter include the gate of the insulated-gate field-effect transistor.

16. The component of claim 1, wherein:

the projecting region comprises insulating regions on each side of the third active region which surmount the depletable zone;

each insulating region comprises a first portion located on an edge of the third active region, the first portion being prolonged substantially at right angles by a second portion that forms the insulating layer of the insulated-gate field-effect transistor; and the third metallization incorporates a metallic zone.

17. A method of using the component of claim 1, comprising:

applying fixed selected voltages to the second and the third metallizations in order to forward bias the third active region/second active region junction;

applying to the first metallization a variable bias voltage to reverse bias the first active region/second active region junction and deplete the depletable zone; and obtaining negative dynamic resistance from a current/voltage relationship in the first active region.

18. The component of claim 1, wherein the projecting region comprises insulating regions on each side of the third active region which surmount the entire depletable zone.

19. A method of using the component of claim 16, comprising:

applying fixed selected voltages to the first and the second metallizations in order to forward bias the first active region/second active region junction;

applying to the third metallization a bias voltage for depleting the channel of the insulated-gate field-effect transistor;

obtaining the negative dynamic resistance from a current/voltage relationship in the third active region.

20. An electronic semiconductor component comprising:

a semiconductor substrate;

a first active region in the substrate having a first conductivity;

a projecting region on an upper face of the substrate, the projecting region comprising a third active region having the first conductivity;

a second active region having a second conductivity opposite the first conductivity, the second active region located between the first active region and the upper face of the substrate and comprising:

a first part located under the third active region and a depletable zone extending from the first part of the second active region between the first active region and the upper face of the substrate;

a depleter for depleting the depletable zone under the action of a selected bias voltage;

first, second and third metallizations respectively in contact with the first active region, the second active region, and a third active region;

wherein the component is adapted to have a negative dynamic resistance;

a metallic zone surmounting an insulating layer located on the upper face of the substrate above the depletable zone, resulting in a metallic zone/insulating layer/depletable zone/first active region stack forming an insulated-gate field-effect transistor wherein the metallic zone of which forms the gate and a channel region forms the depletable zone, wherein the depleter include the gate of the insulated-gate field-effect transistor, and wherein:

the projecting region comprises insulating regions on each side of the third active region which surmount the depletable zone;

the insulating regions comprise different insulating materials;

the depleter comprises a junction between the first active region and the second part forming the depletable zone and a gate of the insulated-gate field-effect transistor;

each insulating region comprises a first portion located on an edge of the third active region, the first portion being prolonged substantially at right angles by a second portion that forms the insulating layer of the insulated-gate field-effect transistor; and a metallization located in contact with the third active region incorporates the metallic zone.

* * * * *